United States Patent [19]

Stricklin, Jr.

[11] 4,182,977

[45] Jan. 8, 1980

[54] CONSTANT OUTPUT LIGHT EMITTING DEVICE

[75] Inventor: Robert S. Stricklin, Jr., Dallas, Tex.

[73] Assignee: TRW Inc., Los Angeles, Calif.

[21] Appl. No.: 911,431

[22] Filed: Jun. 1, 1978

[51] Int. Cl.² .......................................... H05B 43/00
[52] U.S. Cl. ................................... 315/158; 250/205;
  250/239; 315/151; 315/156; 315/307
[58] Field of Search ............... 315/151, 156, 158, 307;
  307/311; 250/205, 552, 239

[56] References Cited

U.S. PATENT DOCUMENTS

| 3,755,679 | 8/1973 | Otsuka | 315/158 X |
| 3,796,916 | 3/1974 | DeBelder et al. | 315/151 |
| 3,931,513 | 1/1976 | Germain | 250/205 |

OTHER PUBLICATIONS

Thomas et al., *Digital Feedback LED Control*, IBM Technical Disclosure Bulletin, vol. 16, No. 8, Jan. 1974 pp. 2598-2600.

*Primary Examiner*—Eugene R. LaRoche
*Attorney, Agent, or Firm*—Jack A. Kanz

[57] ABSTRACT

A light emitting device which provides substantially constant output power is disclosed. The light emitting device includes a light emitter and a compensating circuit for supplying current to the light emitter so that at any given time an increase in electric current produces a corresponding increase in light intensity. The compensating circuit includes a following circuit for supplying current to the light emitter, a differential isolation amplifier for driving the following circuit and a light sensor and its related circuitry. The light sensor is in proximity to and substantially to the side of the light emitter and is connected in a feedback relationship to the differential isolation amplifier. In one arrangement, the compensating circuit is an integrated circuit, and the light emitter and compensating circuit are mounted on a header. The header forms a recess, and the light emitter is mounted on the header in the recess. In one arrangement, a substantially clear overcoat substantially covers both the light sensor and the light emitting surface of the light emitter in such a way that substantially all of the light emitted from the light emitter is transmitted through the overcoat, but some of the light is reflected to the light sensor. In one arrangement, the integrated circuit also includes circuitry to limit the current supplied to the light emitter to a predetermined maximum level.

8 Claims, 4 Drawing Figures

CONSTANT OUTPUT LIGHT EMITTING DEVICE

BACKGROUND OF THE INVENTION

1. Field of the invention

The present invention relates generally to light emitting devices, and in one of its aspects, to a light emitting device that has a substantially constant output power.

2. Description of the Prior Art

Normally a light emitter such as a light emitting diode is placed in a circuit that supplies it with a relatively constant current. Most such devices, such as gallium arsenide light emitting diodes, have continually decreasing output power for a given current over the life of the device.

In the past, both a light emitting chip and an integrated circuit including a light sensor have been mounted on a single header in such a way that the light sensor senses the light emitted by the light emitter. Such combinations have occurred in optical isolators, and were used only for electrical isolation.

Light emitting devices such as light emitting diodes have a variety of uses, some of which would be better served if the output of the light emitting devices could be made fairly constant during periods of use over a long period of time. One such use is for determining the reflectivity at a given moment of a surface of variable reflectivity. The light emitting device is positioned near the variably reflecting surface and turned on. A light sensor is placed in proximity to the light emitter in such a way that the sensor senses light reflected from the variably reflecting surface. In order to know what the reflectivity of the surface is based upon the amount of light sensed by the sensor, the amount of light emitted by the light emitter must be known. It is difficult to predict the amount of light emitted from a conventional light emitting device, making it difficult to determine the reflectivity of the surface.

SUMMARY OF THE INVENTION

The present invention concerns a light emitting device to be used in conjunction with a power supply. The light emitting device can be made switchable between on and off or can be made to remain on. The light emitting device includes a light emitter for emitting light when supplied with electric current. The light emitter is of the standard type so that an increase in electric current supplied to the light emitter increases the output light intensity. The light emitting device also includes a compensating circuit, which is preferably an integrated circuit, powered by the power supply and electrically connected to the light emitter for supplying current to the light emitter. The compensating circuit includes a light sensor in proximity to and substantially to the side of the light emitter. The light sensor is situated in such a way that part of the light emitted is sensed by the light sensor, but that the light sensor does not block a substantial part of the light emitted. One means for directing some of the light to the light sensor is to substantially cover the light emitting surface of the light emitter with a substantially clear overcoat of a selected index of refraction so that substantially all of the light emitted from the light emitter is transmitted through the overcoat, but part of the light emitted is reflected by the overcoat to the light sensor.

The compensating circuit is responsive to the light intensity sensed by the light sensor, increasing the current supplied to the light emitter as the intensity of the light sensed decreases. A preferred arrangement of the compensating circuit includes a following circuit for supplying current to the light emitter, a differential isolation amplifier for driving the following circuit, and a circuit for driving the light sensor. The differential isolation amplifier for driving the following circuit includes a first input and a second input. The circuit for driving the light sensor is connected in a feedback relationship to the first input of the differential isolation amplifier whereby the compensating circuit is responsive to the light sensed by the light sensor when the second input to the differential isolation amplifier is at a predetermined voltage level. The predetermined level can be ground or some other voltage level always available to the device so that the second input can be hard wired to an on position. On the other hand the predetermined level for the second input can be one level of a logic gate, where the other level of the logic gate will turn the device off. One arrangement of the compensating circuit includes a means for limiting the current supply to the light emitter to a predetermined maximum level so that the device will not be destroyed, and other damage to the host apparatus can be avoided.

A preferred arrangement of the light emitting device includes a header for mounting electrical components, and the light emitter and the compensating circuit are mounted on the header. In such an arrangement, the compensating circuit comprises an integrated circuit. In a preferred form, the header forms a recess for mounting the light emitter, and the light emitter is mounted on the header in the recess. In such an arrangement, the substantially clear overcoat substantially covers both the light sensor and the light emitting surface of the light emitter. Mounting the light emitter in the recess directs more of the emitted light in a single direction. Some light is still reflected by the overcoat to the light sensor.

These and other objects, advantages and features of this invention will be apparent from the following description taken with reference to the accompanying drawings, wherein is shown the preferred embodiments of the invention.

DETAILED DESCRIPTION

Figure 1:
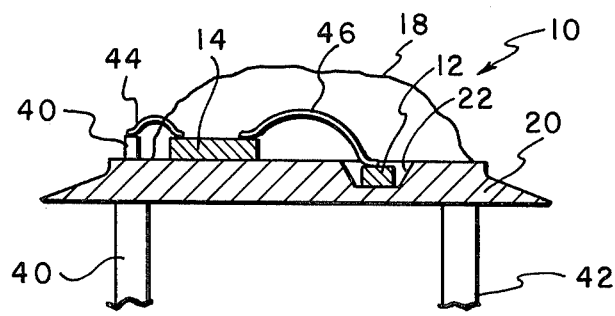
FIG. 1 is a sectional view of a light emitting device in accordance with the present invention.
Figure 2:
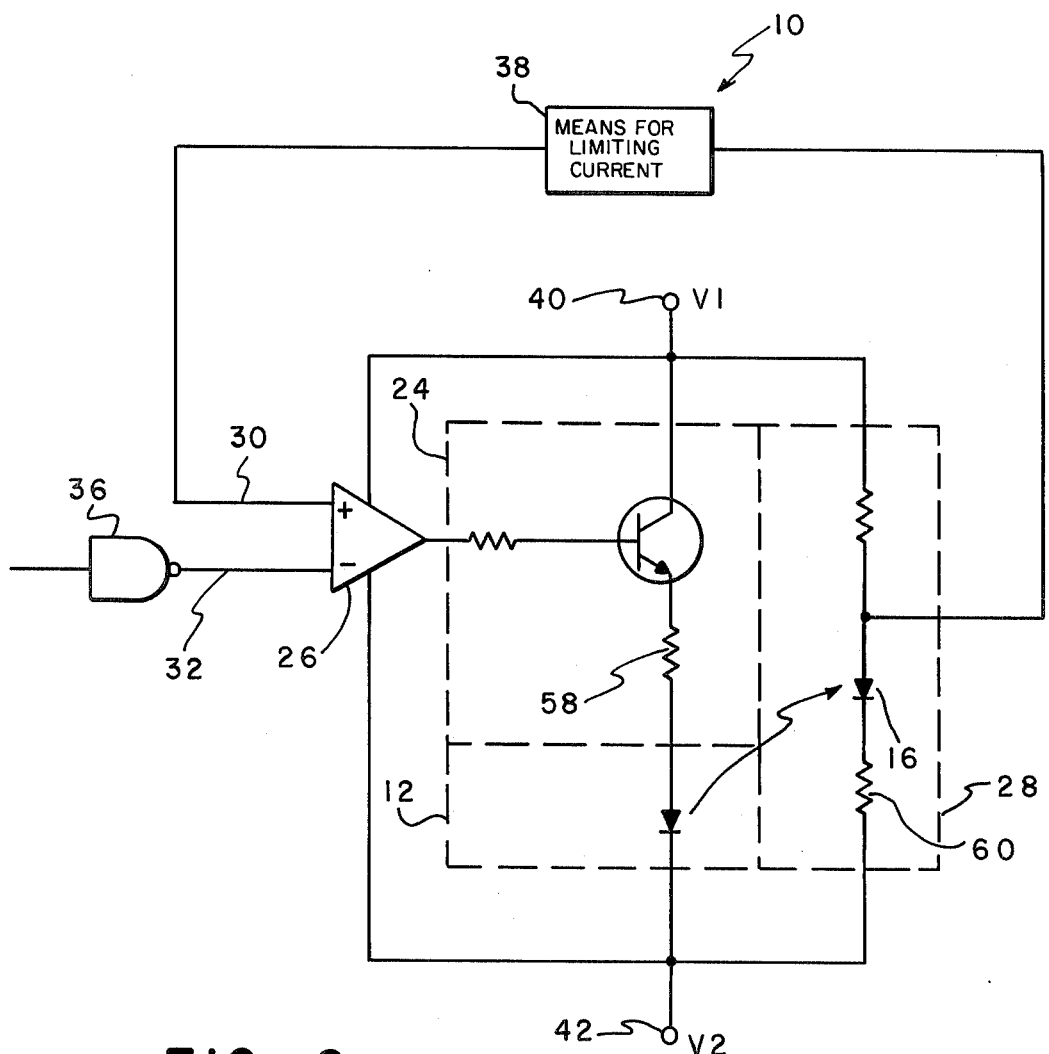
FIG. 2 is a schematic representation of a light emitting device in accordance with the present invention.

Referring now to the drawings, a light emitting device in accordance with the present invention is referred to generally by reference numeral 10 and includes a light emitter 12 for emitting light when supplied with electric current, wherein at any given time an increase in electric current supplied to light emitter 12 increases the output light intensity. Light emitting device 10 further includes a compensating circuit, which in this case is integrated circuit 14, electrically connected to light emitter 12 for supplying current to the light emitter. Integrated circuit 14 includes a light sensor 16 in proximity to and substantially to the side of light emitter 12. Integrated circuit 14 is responsive to the light intensity sensed by light sensor 16, increasing the current supplied to light emitter 12 as the intensity of the light sensed decreases. "To the side of" in this instance refers to being so positioned as to not block a substantial amount of the light emitted from light emitter 12.

A preferred embodiment of light emitting device 10 further includes a substantially clear overcoat 18 substantially covering the light emitting surface of light emitter 12 wherein part of the light emitted from light emitter 12 is transmitted through overcoat 18 and part of the light emitted is reflected by the overcoat to light sensor 16. "Reflected by the overcoat" is used here to also include reflected at the interface of the overcoat and its surrounding medium. "Substantially clear" as used here means substantially transparent to the wavelengths of interest. In a preferred embodiment of light emitting device 10, substantially all of the light emitted from light emitter 12 is transmitted through overcoat 18 although some is still reflected to light sensor 16.

One embodiment of light emitting device 10 further includes a header 20 for mounting electrical components. Light emitter 12 and integrated circuit 14 are mounted on header 20. A preferred embodiment of header 20 forms a recess 22 for mounting light emitter 12. Light emitter 12 is mounted on header 20 in recess 22, and substantially clear overcoat 18 substantially covers both light sensor 16 and the light emitting surface of light emitter 12.

In one embodiment, light emitter 12 is a light emitting diode such as a gallium arsenide type light emitting diode, and integrated circuit 14 comprises in combination a following circuit 24 for supplying current to light emitter 12, a differential isolation amplifier 26 for driving following circuit 24, and a circuit 28 for driving light sensor 16. Differential isolation amplifier 26 has a first input 30 and a second input 32. Circuit 28 for driving light sensor 16 is connected in a feedback relationship to first input 30 of differential isolation amplifier 26 whereby integrated circuit 14 is responsive to the light sensed by light sensor 16 when second input 32 to differential isolation amplifier 26 is at a predetermined voltage level. One such predetermined level could be one level of a logic gate 36 which could be included as part of the light emitting device or could be totally separate. In such an embodiment, the other level of logic gate 36 is preferably such that it completely switches light emitting device 10 to an off state. In such an embodiment, light emitting device 10 is completely logic driven, and can be switched on and off. In an alternative embodiment, second input 32 of differential isolation amplifier 26 is maintained at the predetermined voltage level to keep the device on so long as it is supplied with the proper power voltage.

In one embodiment, integrated circuit 14 further comprises means 38 for limiting the current supplied to light emitter 12 to a predetermined maximum level. In the embodiment illustrated, means 38 limits the current supplied to light emitter 12 indirectly by limiting the amount of feedback from circuit 28 for driving light sensor 16. A different means 38 could also be constructed to limit the current supplied to light emitter 12 directly.

Light emitting device 10 is to be used in conjunction with a power supply and include a means for electrically connecting integrated circuit 14 to the power supply. One means for electrically connecting the integrated circuit to the power supply includes two plug-in posts 40 and 42 attached to header 20. One plug-in post, 40 or 42, is for connecting to each of two different electric potentials, V1 and V2, of the power supply. The means for electrically connecting integrated circuit 14 to the power supply further includes means for electrically connecting integrated circuit 14 to the two posts 40 and 42, such means including conducting lead 44 for electrically connecting integrated circuit 14 to post 40 and electrically conducting header 20 for electrically connecting integrated circuit 14 to post 42. In the embodiment illustrated, light emitting device 10 further includes electrically conducting lead 46 for connecting integrated circuit 14 to light emitter 12 and electrically conducting header 20 for connecting light emitter 12 to post 42.

Reference has not been made to such conventional elements as preforms or insulators between the electrical components and header 20 although they may be desirable.

Figure 3:
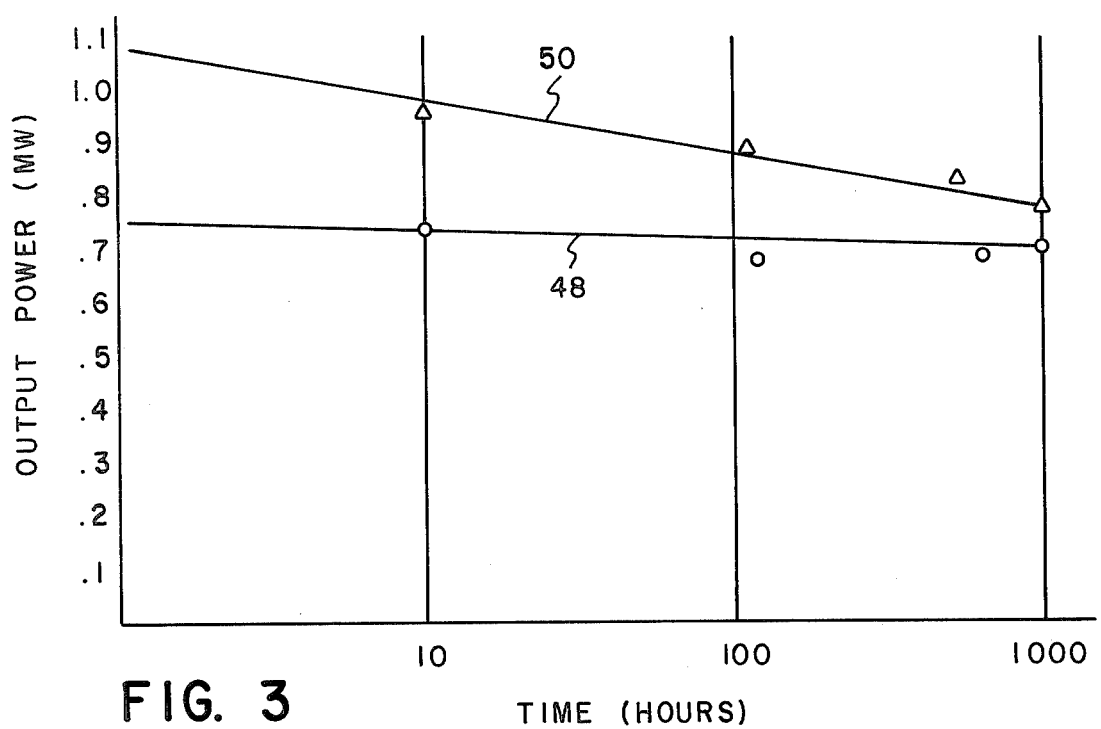
FIG. 3 is a semi-log graph of output power versus time for a typical light emitting device and a light emitting device in accordance with the present invention.

It can thus be seen that the intensity of light transmitted from light emitter 12 and hence light emitting device 10 when light emitting device 10 is on remains substantially constant over the useful life of light emitter 12. Referring now to FIG. 3, a semi-log plot of output power versus time for a light emitting device according to the present invention is referred to by reference numeral 48 and a plot of output power for a conventional device similar to light emitter 12 with constant driving current is referred to by reference numeral 50. When driven by a constant driving current, a light emitter such as light emitter 12 has constantly decreasing output power so that the light intensity varies considerably over the useful life of the device. The light intensity of a device according to the present invention, on the other hand, remains substantially constant until light emitter 12 has degraded so much that it must be discarded. By properly selecting the design components in a light emitting device according to the present invention, it is even possible to increase the light intensity with time. Further, the principles of the present invention would apply to creating a light emitting device with substantially constant output power despite changes in temperature or other operating conditions. A device according to the present invention can be used to minimize performance variations between different light emitters.

Figure 4:
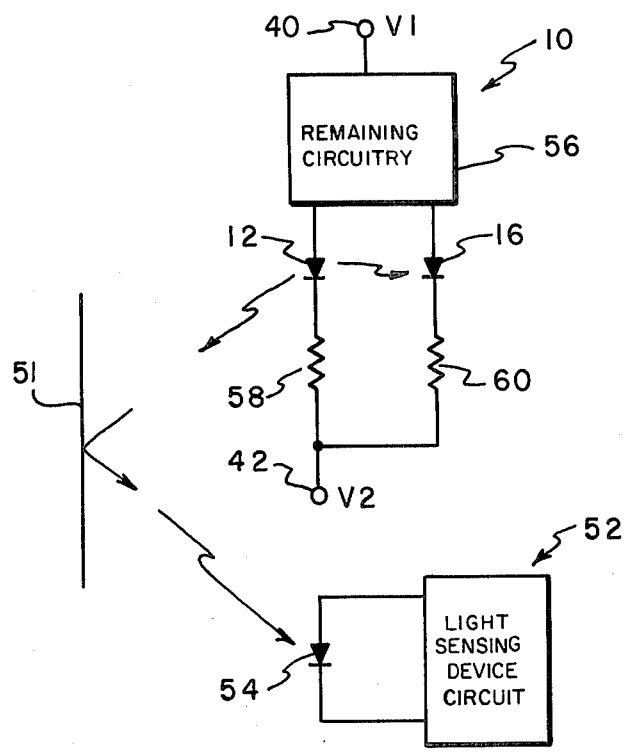
FIG. 4 is a pictorial representation of a light emitting device in accordance with the present invention being used with a light sensor in order to measure the reflectivity of a surface.

Referring now to FIG. 4, one useful application of a device according to the present invention is to measure the reflectivity of a variably reflecting surface 51. Light emitting device 10 is placed in proximity to variably reflecting surface 51 so that the light it emits is reflected off the surface. A light sensing device 52 including a light sensor 54 is also placed in proximity to variably reflecting surface 51 so that the light emitted from light emitting device 10 and reflected off variably reflecting surface 51 is sensed by light sensing device 52. Since the light emitted by light emitting device 10 is substantially constant, the light sensed by light sensing device 52 is a good indication of the reflectivity of surface 51. If, on the other hand, a typical light emitter not according to the present invention were used, there would have to be some way of compensating for the variability of the light emitter in order to determine the true reflectivity of surface 51. Resistors 58 and 60 can simply be the internal resistances of light emitter 12 and light sensor 16 respectively or can be separate resistors. The remaining circuitry 56 of device 10 is the same as shown in the preferred embodiment.

As can be seen from the foregoing description, a device according to the present invention can be made as a single, plug-in component, and except in cases where the device is logic driven, can be a simple two lead device. Such a device is especially well suited for an optical isolator since the light sensor can be finely tuned because of the predictability of the output power level. Such a device can be made to work off a plus and minus 15 volts which are common voltages for microprocessors, or can be made to operate off five volts which is typical for many optical systems.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and and not in a limiting sense.

The invention having been described, what is claimed is:

1. A light emitting device to be used in conjunction with a power supply, comprising in combination:
   a light emitter for emitting light when supplied with electric current, wherein an increase in electric current supplied to the light emitter increases the output light intensity;
   a compensating circuit comprising an integrated circuit powered by the power supply, electrically connected to the light emitter for supplying current to the light emitter, the compensating circuit including a light sensor in proximity to and substantially to the side of the light emitter wherein the compensating circuit is responsive to the light intensity sensed by the light sensor, increasing the current supplied to the light emitter as the intensity of the light sensed decreases;
   means for electrically connecting the compensating circuit to the power supply;
   a substantially clear overcoat substantially covering the light emitting surface of the light emitter wherein part of the light emitted from the light emitter is transmitted through the overcoat and part of the light emitted is reflected by the overcoat to the light sensor, whereby the intensity of light transmitted through the overcoat when the light emitting device is on remains substantially constant over the useful life of the light emitter; and
   a header for mounting electrical components, wherein the light emitter and the compensating circuit are mounted on the header;
   wherein the header forms a recess for mounting the light emitter, and the light emitter is mounted on the header in the recess, and wherein the substantially clear overcoat substantially covers both the light sensor and the light emitting surface of the light emitter.

2. A light emitting device according to claim 1 wherein substantially all of the light emitted from the light emitter is transmitted through the overcoat.

3. A light emitting device to be used in conjunction with a power supply, comprising in combination:
   a light emitter consisting of a light emitting diode for emitting light when supplied with electric current, wherein an increase in electric current supplied to the light emitter increases the output light intensity;
   a compensating circuit comprising an integrated circuit powered by the power supply, electrically connected to the light emitter for supplying current to the light emitter, the compensating circuit including in combination: a light sensor in proximity to and substantially to the side of the light emitter wherein the compensating circuit is responsive to the light intensity sensed by the light sensor, increasing the current supplied to the light emitter as the intensity of the light sensed decreases; a following circuit for supplying current to the light emitter; a differential isolation amplifier for driving the following circuit, having a first input and a second input; and a circuit for driving the light sensor, wherein the circuit for driving the light sensor is connected in a feedback relationship to the first input of the differential isolation amplifier whereby the integrated circuit is responsive to the light sensed by the light sensor when the second input to the differential isolation amplifier is at a predetermined voltage level;
   means for electrically connecting the compensating circuit to the power supply; and
   a substantially clear overcoat substantially covering the light emitting surface of the light emitter wherein substantially all of the light emitted from the light emitter is transmitted through the overcoat and part of the light emitted is reflected by the overcoat to the light sensor, whereby the intensity of light transmitted through the overcoat when the light emitting device is on remains substantially constant over the useful life of the light emitter; and
   a header for mounting electrical components, wherein the light emitter and the compensating circuit are mounted on the header;
   wherein the header forms a recess for mounting the light emitter, and the light emitter is mounted on the header in the recess, and wherein the substantially clear overcoat substantially covers both the light sensor and the light emitting surface of the light emitter.

4. A light emitting device according to claim 3 wherein the integrated circuit further comprises means for limiting the current supplied to the light emitter to a predetermined maximum level.

5. A light emitting device according to claim 3 to be used in conjunction with a logic gate wherein the predetermined voltage level of the second input corresponds to a first output voltage level of the logic gate and wherein the light emitting device is switched off when the second input of the differential isolation amplifier is at a second predetermined voltage level, the second predetermined voltage level corresponding to a second output voltage level of the logic gate whereby the logic gate can switch the light emitting device on and off when the output of the logic gate controls the second input to the differential isolation amplifier.

6. A light emitting device to be used in conjunction with a power supply, comprising in combination:
a light emitter for emitting light when supplied with electric current, wherein an increase in electric current supplied to the light emitter increases the output light intensity;
a compensating circuit powered by the power supply, electrically connected to the light emitter for supplying current to the light emitter, the compensating circuit including in combination: a light sensor in proximity to and substantially to the side of the light emitter wherein the compensating circuit is responsive to the light intensity sensed by the light sensor, increasing the current supplied to the light emitter as the intensity of the light sensed decreases; a following circuit for supplying current to the light emitter; a differential isolation amplifier for driving the following circuit, having a first input and a second input; and a circuit for driving the light sensor, wherein the circuit for driving the light sensor is connected in a feedback relationship to the first input of the differential isolation amplifier whereby the compensating circuit is responsive to the light sensed by the light sensor when the second input to the differential isolation amplifier is at a predetermined voltage level;
means for electrically connecting the compensating circuit to the power supply; and
a substantially clear overcoat substantially covering the light emitting surface of the light emitter wherein substantially all of the light emitted from the light emitter is transmitted through the overcoat and part of the light emitted is reflected by the overcoat to the light sensor, whereby the intensity of light transmitted through the overcoat when the light emitting device is on remains substantially constant over the useful life of the light emitter.

7. A light emitting device according to claim 6 wherein the compensating circuit further comprises means for limiting the current supplied to the light emitter to a predetermined maximum level.

8. A light emitting device according to claim 6 to be used in conjunction with a logic gate wherein the predetermined voltage level of the second input corresponds to a first output voltage level of the logic gate and wherein the light emitting device is switched off when the second input of the differential isolation amplifier is at a second predetermined voltage level, the second predetermined voltage level corresponding to a second output voltage level of the logic gate whereby the logic gate can switch the light emitting device on and off when the output of the logic gate controls the second input to the differential isolation amplifier.

* * * * *